US011557595B2

(12) United States Patent
Lee et al.

(10) Patent No.: US 11,557,595 B2
(45) Date of Patent: Jan. 17, 2023

(54) MEMORY DEVICE (71) Applicant: Winbond Electronics Corp., Taichung (TW)

(72) Inventors: Shu-Ming Lee, Taichung (TW); Tzu-Ming Ou Yang, Tainan (TW); Meng-Chang Chan, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 195 days.

(21) Appl. No.: 16/925,603

(22) Filed: Jul. 10, 2020

(65) Prior Publication Data
US 2020/0343255 A1 Oct. 29, 2020

Related U.S. Application Data (62) Division of application No. 16/382,743, filed on Apr. 12, 2019, now Pat. No. 10,756,099.

(30) Foreign Application Priority Data

Apr. 13, 2018 (TW) ................. 107112732

(51) Int. Cl.
*H01L 21/768* (2006.01)
*H01L 27/11519* (2017.01)
*H01L 27/11526* (2017.01)
(52) U.S. Cl.
CPC .. *H01L 27/11519* (2013.01); *H01L 27/11526* (2013.01)
(58) Field of Classification Search
CPC .................................................. H01L 23/5226
See application file for complete search history.

(56) References Cited

U.S. PATENT DOCUMENTS 5,856,707 A * 1/1999 Sardella .............. H01L 23/5226
257/E23.145
2004/0219729 A1* 11/2004 Kang ........................ G11C 7/00
438/200
(Continued)

FOREIGN PATENT DOCUMENTS

| CN | 101315936 A | 12/2008 |
| KR | 10-1002519 B1 | 12/2010 |

(Continued)

OTHER PUBLICATIONS

Office Action dated Sep. 2, 2021 in CN Application No. 201810329463.0 is attached, 5 pages.

*Primary Examiner* — Christopher A Johnson
(74) *Attorney, Agent, or Firm* — Muncy, Geissler, Olds & Lowe, P.C.

(57) ABSTRACT

A memory device and a method for manufacturing the memory device are provided. The memory device includes a substrate, a plurality of first gate structures, a first dielectric layer, a second dielectric layer, a third dielectric layer and a contact plug. The first gate structures are formed on an array region of the substrate. The first dielectric layer is formed on top surfaces and sidewalls of the first gate structures. The second dielectric layer is formed on the first dielectric layer and in direct contact with the first dielectric layer. The second dielectric layer and the first dielectric layer are made of the same material. The third dielectric layer is formed between the first gate structures and defines a plurality of contact holes exposing the substrate. The contact plug fills the contact holes.

11 Claims, 11 Drawing Sheets (56) References Cited

U.S. PATENT DOCUMENTS

| | | | | |
|---|---|---|---|---|
| 2011/0241093 A1* | 10/2011 | Wu | ................... | H01L 29/66795 |
| | | | | 257/302 |
| 2015/0194314 A1* | 7/2015 | Chu | ................... | H01L 29/7881 |
| | | | | 438/666 |
| 2016/0071863 A1* | 3/2016 | Kaneko | ............ | H01L 27/11536 |
| | | | | 257/314 |
| 2016/0293616 A1* | 10/2016 | Nagai | ................. | H01L 29/6659 |
| 2018/0113969 A1* | 4/2018 | Chen | ..................... | H01L 25/065 |

FOREIGN PATENT DOCUMENTS

| | | |
|---|---|---|
| TW | 200537642 A | 11/2005 |
| TW | 201113982 A | 4/2011 |

* cited by examiner

MEMORY DEVICE

CROSS REFERENCE TO RELATED APPLICATIONS

This application is a Divisional of U.S. patent application Ser. No. 16/382,743, filed on Apr. 12, 2019, which claims priority of Taiwan Patent Application No. 107112732, filed on Apr. 13, 2018, the entirety of which are incorporated by reference herein.

BACKGROUND

Field of the Disclosure

The present disclosure relates to a memory device, and in particular to a non-volatile memory device and a method for manufacturing the non-volatile memory device.

Description of the Related Art

With the increasing popularity of portable electronic products, consumer demand for memory devices is also increasing. All portable electronic products (such as digital cameras, notebook computers, mobile phones, etc.) need a miniaturized and reliable memory device for the storage and transmission of data. Flash memory is a non-volatile memory which can be rewritten at any time while the computer is operating, and has gradually become the mainstream of non-volatile memory because of its lower cost.

With the trend of miniaturization of electronic products, there is also demand for miniaturization of non-volatile memory devices. Moreover, reliability and yield issues of existing non-volatile memory devices will become more severe with miniaturization. For example, in a miniaturized non-volatile memory device, the distance between the gate structures is small so that the self-aligned trenches between the gate structures have a high aspect ratio. In a conventional non-volatile memory device, the steps of forming a self-aligned trench includes forming a hard material (such as polycrystalline silicon) between the gate structures using a general deposition process (such as a chemical vapor deposition process or a physical vapor deposition process), followed by patterning the polycrystalline silicon to define a recessed region above the gate structure, filling the recessed region with a dielectric material, and finally removing the polycrystalline silicon to form a self-aligned trench. However, it is difficult to completely fill the space between the gate structures with polycrystalline silicon. Therefore, there may be seams formed in the polycrystalline silicon. As a result, it will be difficult to completely remove the polycrystalline silicon below the seams in the subsequent step of removing the polycrystalline silicon. Furthermore, in the subsequent step of removing the material between the gate structures to expose the substrate, it will be difficult to remove the material (such as the dielectric layer) below the polycrystalline silicon due to the residual polycrystalline silicon. Since contact plugs or isolation structures will be formed between the gate structures, these residual materials will increase the electrical resistance value of the contact plugs or reduce the insulating ability of the isolation structure, and even cause the contact plugs to fail to electrically connect to the substrate or cause localized shorts. Therefore, these residual materials will be harmful to the operation of the memory device. In addition, because the positions and sizes of the seams in the polycrystalline silicon are uncontrollable, uncontrollable variations in the electrical resistance value between these contact plugs or between these isolation structures may occur. As a result, the yield and reliability of memory devices may be significantly reduced. It should be noted that the aforementioned problems caused by the seams will be more severe when the critical dimensions are reduced. Therefore, there is still a need for improving the reliability and yield of the miniaturized non-volatile memory devices.

BRIEF SUMMARY

The disclosure provides a memory device and a method of manufacturing the same, which can improve the yield and reliability of a miniaturized memory device.

Some embodiments of the disclosure provide a memory device. The memory device includes a substrate, a plurality of first gate structures formed on the substrate, a first dielectric layer formed on top surfaces and sidewalls of the plurality of first gate structures, and a second dielectric layer formed on the first dielectric layer. The second dielectric layer is in direct contact with the first dielectric layer, and the second dielectric layer and the first dielectric layer are made of the same material. The memory device also includes a third dielectric layer formed on the first dielectric layer which is between the plurality of first gate structures. The third dielectric layer defines a plurality of contact holes exposing the substrate. The memory device also includes a contact plug filling the plurality of contact holes. The memory device includes an array region and a peripheral region, and the plurality of first gate structures are formed in the array region.

Other embodiments of the disclosure provide a method for manufacturing a memory device. The method includes providing a substrate, forming a plurality of first gate structures on the substrate, and forming a first dielectric layer over the substrate and on top surfaces and sidewalls of the plurality of first gate structures. The first dielectric layer does not fully fill a trench between the plurality of first gate structures. The method also includes forming a gap-filling dielectric structure on the first dielectric layer and filling the trench with the gap-filling dielectric structure. The gap-filling dielectric structure and the first dielectric layer are made of different materials. Forming the gap-filling dielectric structure includes a planarization step so that a top surface of the gap-filling dielectric structure is coplanar with a top surface of the first dielectric layer. The method also includes forming a second dielectric layer on the first dielectric layer and the gap-filling dielectric structure. The second dielectric layer is in direct contact with the first dielectric layer, and the second dielectric layer and the first dielectric layer are made of the same material. The method also includes performing a first etching process to remove the second dielectric layer and the gap-filling dielectric structure between the plurality of first gate structures, and forming a third dielectric layer on the first dielectric layer which is between the plurality of first gate structures. The third dielectric layer defines a plurality of contact holes to expose the substrate. The method also includes filling the plurality of contact holes with a conductive material to form a contact plug. The memory device includes an array region and a peripheral region, and the plurality of first gate structures formed in the array region.

DETAILED DESCRIPTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

Figure 1:
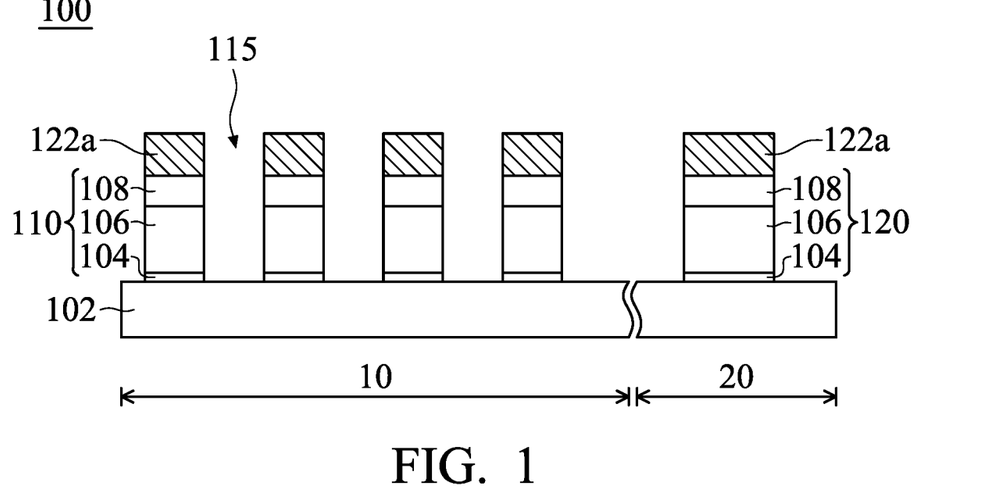
FIGS. 1-4, 5B, 5C, 6B, 7B, 7C, 8B, 8C, 9B, 10B, and 10C show cross-sectional views of a memory device at various stages of the manufacturing process in accordance with some embodiments.

Referring to FIG. 1, the memory device 100 includes an array region 10 and a peripheral region 20 adjacent to the array region 10. A tunneling oxide layer 104, a gate material layer 106, a gate conductor layer 108, and a first dielectric material 122a are sequentially deposited on the substrate 102. Then, the tunneling oxide layer 104, the gate material layer 106, the gate conductor layer 108, and the first dielectric material 122a are patterned to form a plurality of trenches 115. As a result, a plurality of first gate structures 110 are formed on the substrate 102 of the array region 10, and a plurality of second gate structures 120 are formed on the substrate 102 of the peripheral region 20. As shown in FIG. 1, each of the first gate structures 110 and second gate structures 120 includes the tunneling oxide layer 104, the gate material layer 106, and the gate conductor layer 108 that are patterned. The top surfaces of the first gate structures 110 and the second gate structures 120 are covered with a patterned first dielectric material 122a.

The material of the substrate 102 may include silicon, silicon-containing semiconductor, silicon on insulator (SOI), another suitable material, or a combination thereof. In some embodiments, the substrate 102 is a silicon substrate. In some embodiments, other structures may be formed in the substrate 102, such as an N-well region, a P-well region, a P/N junction, or an isolation structure. The gate material layer 106 may include a floating gate layer, a dielectric layer, and a control gate layer that are sequentially stacked. The material of the floating gate layer and the control gate layer may include polycrystalline silicon. The gate conductor layer 108 may electrically connect the gate material layer 106 to other elements. The material of gate conductor layer 108 may include tungsten, aluminum, copper, gold, silver, tantalum, titanium, other suitable metallic material, or a combination thereof.

Figure 2:
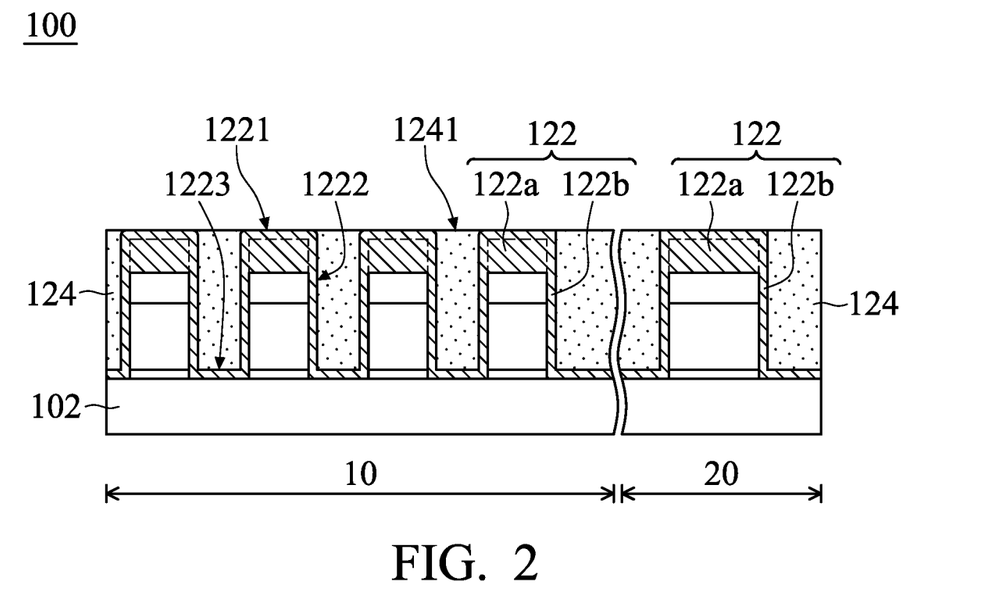

Referring to FIG. 2, the first dielectric material 122b is conformally formed on the substrate 102 on which the patterned tunneling oxide layer 104, the patterned gate material layer 106, the patterned gate conductor layer 108, and the patterned first dielectric material 122a are formed. As a result, the first dielectric layer 122 covers the top surfaces and the sidewalls of the first gate structures 110 and the second gate structures 120, and covers the substrate 102. In this specification, the first dielectric materials 122a and 122b are collectively referred to as "the first dielectric layer 122". In FIG. 2, since the first dielectric materials 122a and 122b are the same material formed in different steps, the interfaces of the first dielectric materials 122a and 122b are depicted by dashed lines. For simplicity of illustration, in FIGS. 3-11, only a single dielectric layer 122 is shown. The top surface 1221 of the first dielectric layer 122 is opposite to the top surface of the first gate structure 110 (the second gate structure 120), and the side surface 1222 is opposite to the sidewall of the first gate structure 110 (the second gate structure 120). Furthermore, the bottom surface 1223 is opposite to the substrate 102. In other words, the substrate 102 on which the first gate structures 110, and the second gate structures 120 are formed is blanketed with the first dielectric layer 122, and the trench 115 is not fully filled with the first dielectric layer 122. Furthermore, the first dielectric layer 122 may have suitable etching resistance, so that the first dielectric layer 122 can protect the first gate structures 110 and the second gate structures 120 from being damaged during the subsequent etching process. As a result, the yield of the memory device 100 will be improved. The first dielectric materials 122a and 122b may include a nitride dielectric material. In some embodiments, the first dielectric materials 122a and 122b are silicon nitride. In some embodiments, none of the first dielectric materials 122a and 122b is an oxide. As a result, during the subsequent wet etching capable of removing oxides, the first dielectric layers 122a and 122b can prevent the tunneling oxide layer 104 from being damaged. Therefore, the yield of the memory device 100 will be improved.

Still referring to FIG. 2, a gap-filling dielectric material is formed on the first dielectric layer 122 and filled into the trenches 115. Next, a planarization process (such as a chemical mechanical polishing process) is performed to remove the gap-filling dielectric material outside of the trench 115, and a plurality of gap-filling dielectric structures 124 are formed. Each of the gap-filling dielectric structures 124 fills a corresponding trench 115, and the top surface 1241 of the gap-filling dielectric structure 124 is coplanar with the top surface 1221 of the first dielectric layer 122.

The distance between the first gate structures 110 is much smaller than the distance between the second gate structures 120. If the gap-filling dielectric material is deposited by a general deposition process (for example, a chemical vapor deposition process or a physical vapor deposition process), due to the loading effect, when the trenches 115 of the array region 10 is filled with the gap-filling dielectric material, the trenches 115 of the peripheral region 20 are not yet filled at this time. In some embodiments, the gap-filling dielectric material is formed by a spin coating process. In such an embodiment, the gap-filling dielectric material can completely fill these trenches 115 without creating seams. Therefore, after the planarization process, the top surface 1241 of the gap-filling dielectric structure 124 will be easily coplanar with the top surface 1221 of the first dielectric layer 122. In this way, the reliability of the memory device is improved.

For example, in some embodiments, a gap-filling dielectric material with better fluidity may be coated on the first dielectric layer 122 and filled into the trenches 115 by a spin coating process. Next, the gap-filling dielectric material is cured by light energy or thermal energy. The gap-filling dielectric materials may include oxides, other suitable dielectric materials that have better fluidity, or a combination thereof. In some embodiments, the gap-filling dielectric material is silicon oxide. In some embodiments, the first dielectric layer 122 and the gap-filling dielectric structure 124 are made of different materials. As a result, it is advantageous for forming subsequent self-aligned trenches, and the details will be discussed in the following paragraphs.

Figure 3:
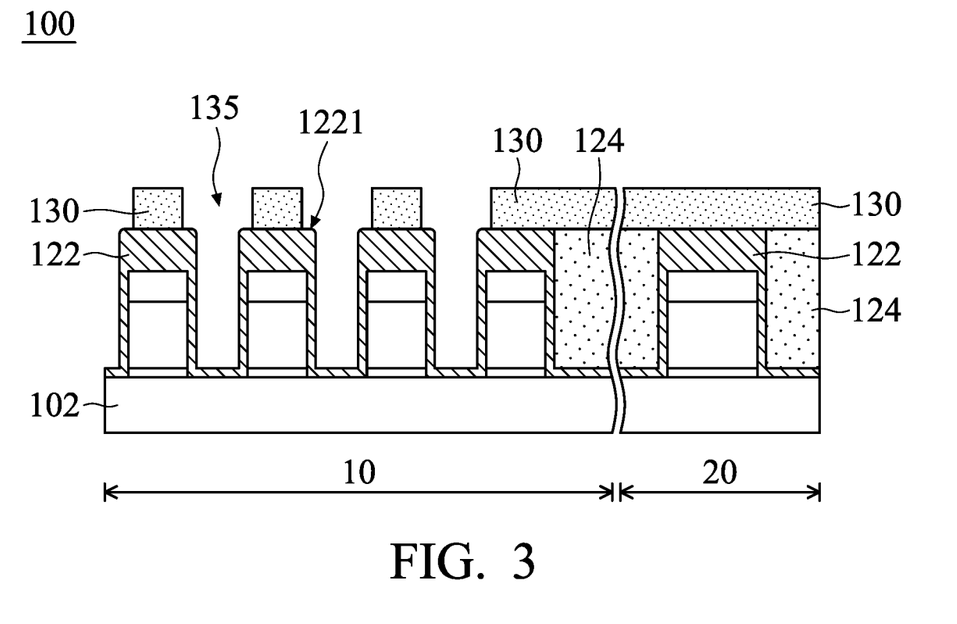

Referring to FIG. 3, the second dielectric layer 130 is formed on the top surface 1221 of the first dielectric layer 122, and the second dielectric layer 130 is in direct contact with the first dielectric layer 122. In this embodiment, the method of forming the second dielectric layer 130 is described in detail as follows.

Firstly, a second dielectric material is formed on the gap-filling dielectric structures 124 and the first dielectric layer 122. It should be noted that if the foregoing step of forming the gap-filling dielectric structures 124 is omitted, the problems caused by the aforementioned loading effect will occur when the second dielectric material is deposited. Furthermore, because the top surface 1221 of the first dielectric layer 122 and the top surface 1241 of the gap-filling dielectric structure 124 are substantially coplanar, the thickness of the second dielectric material can be easily controlled to be substantially uniform. Therefore, the uniformity of the subsequent first etching process is facilitated.

Then, a first etching process is performed in the array region 10 to remove a portion of the second dielectric material and the gap-filling dielectric structures 124 located between the first gate structures 110. As a result, a self-aligned trench 135 is formed between two adjacent first gate structures 110, and a second dielectric layer 130 is formed on the top surface 1221 of the first dielectric layer 122. The second dielectric material may include a nitride dielectric material. In some embodiments, the second dielectric material is silicon nitride. In some embodiments, the first dielectric layer 122 and the second dielectric layer 130 are made of the same material. In this way, it is advantageous for forming the subsequent self-aligned trenches 135. In some embodiments, the thickness of the first dielectric layer 122 may be not less than 30 nm so as to avoid damaging the first gate structures 110 during the process of removing the second dielectric material.

The first etching process may be dry etching, wet etching, or a combination thereof. In some embodiments, the first etching process may include a two-step etching process. In the first step of the first etching process, the etching rate of the second dielectric material is relatively high, so as to efficiently remove the second dielectric material above the gap-filling dielectric structure 124 between the first gate structures 110. As a result, the upper portion of the self-aligned trench 135 is formed. Then, in the second step of the first etching process, the etching rate R1 of the gap-filling dielectric structure 124 is greater than the etching rate R2 of the first dielectric layer 122 and the second dielectric layer 130. Therefore, the second step of the first etching process can completely remove the gap-filling dielectric structure 124 to form the lower portion of the self-aligned trenches 135 with high selectivity, such that the first dielectric layer 122 and the second dielectric material on the top surface 1221 of the first dielectric layer 122 can be retained to form the second dielectric layer 130.

In some embodiments, during the second step of the first etching process, the ratio R1/R2 of the etching rate R1 of the gap-filling dielectric structure 124 to the etching rate R2 of the second dielectric layer 130 is 5-50. In other embodiments, during the second step, the ratio R1/R2 of the etching rate R1 of the gap-filling dielectric structure 124 to the etching rate R2 of the second dielectric layer 130 is 10-30.

As shown in FIG. 3, in some embodiments, the foregoing first etching process is not performed in the peripheral region 20. Therefore, in the peripheral region 20, the second dielectric layer 130 is formed on the gap-filling dielectric structure 124 and first dielectric layer 122. Furthermore, after the first etching process, in the array region 10, the gap-filling dielectric structure 124 is located only on the outer sidewall of the first dielectric layer 122 on the first gate structure 110 that is closest to the peripheral region 20. In the peripheral region 20, the gap-filling dielectric structure 124 is located on the sidewalls of the first dielectric layer 122 on both sides of the second gate structure 120.

As shown in FIG. 3, in the array region 10, after the first etching process is performed, the width of the second dielectric layer 130 on the first gate structure 110 is smaller than the width of the first dielectric layer 122 on the first gate structure 110. In other words, in the array region 10, a portion of the top surface 1221 of the first dielectric layer 122 is not covered by the second dielectric layer 130. As a result, the width of the upper portion of the self-aligned trench 135 will be greater than the width of the lower portion of the self-aligned trench 135. It is advantageous for forming of subsequent contact plugs, and the details will be discussed in the following paragraphs.

Figure 4:
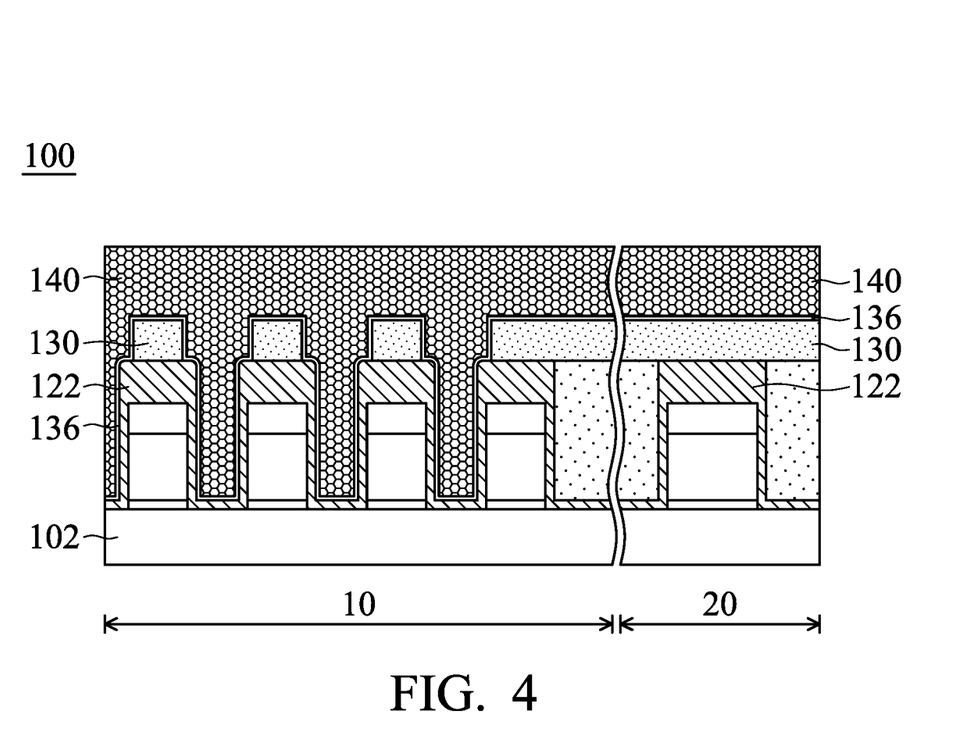

Referring to FIG. 4, a protective liner 136 is conformally formed on the first dielectric layer 122 and the second dielectric layer 130. Then, a photoresist material 140 is formed on the protective liner 136 and filled into the self-aligned trenches 135.

The protective liner 136 is used to prevent the photoresist material 140 from directly contacting the first dielectric layer 122 and the second dielectric layer 130. Therefore, damage to the first dielectric layer 122 and the second dielectric layer 130 caused by the acid component that may be included in the photoresist material 140 can be avoided. In some embodiments, the protective liner 136 may include an oxide. The protective liner 136 may be formed by a suitable deposition process, for example, an atomic layer deposition process.

The photoresist material 140 can be filled into the self-aligned trenches 135 by spin coating, and the aforementioned seams are not generated. Therefore, the foregoing problems caused by the seams can be completely avoided, and the yield and reliability of the memory device 100 can be significantly improved.

Figure 5A:
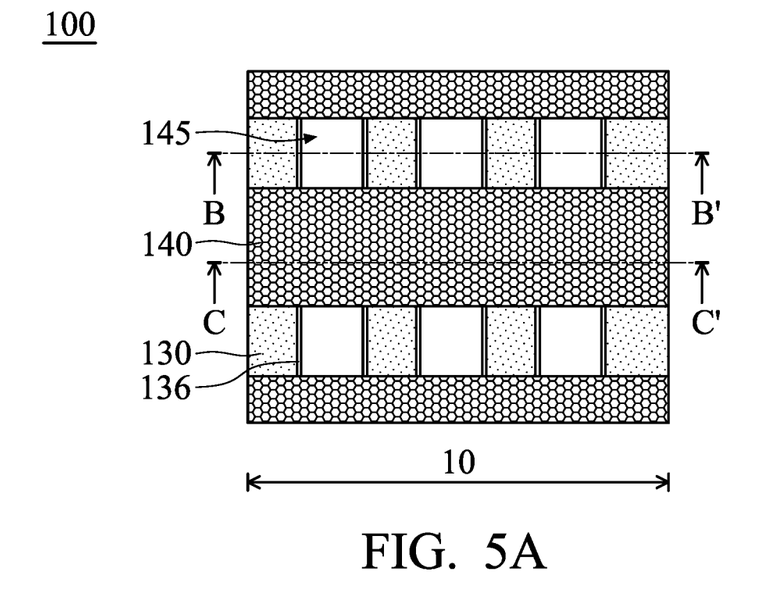
FIGS. 5A, 6A, 7A, 8A, 9A, and 10A show top views of an array region of a memory device at various stages of the manufacturing process in accordance with some embodiments.
Figure 5B:
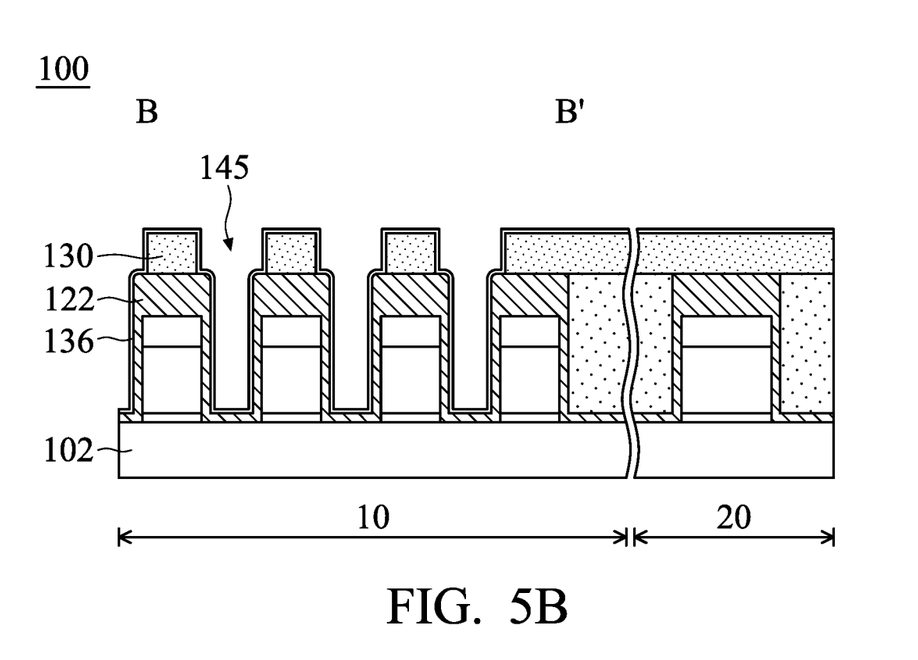
Figure 5C:
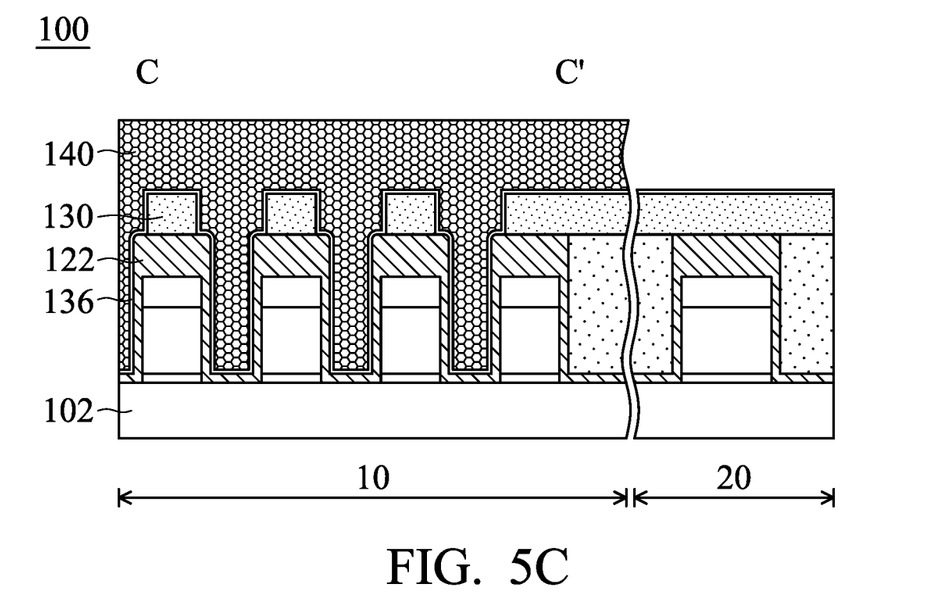

FIG. 5B is a cross-sectional view taken along line BB' of FIG. 5A, and FIG. 5C is a cross-sectional view taken along line CC' of FIG. 5A. Referring to FIGS. 5A, 5B, and 5C, the photoresist material 140 is patterned to form a plurality of first openings 145 between the first gate structures 110, and the photoresist material 140 on the peripheral region 20 is removed.

Figure 6A:
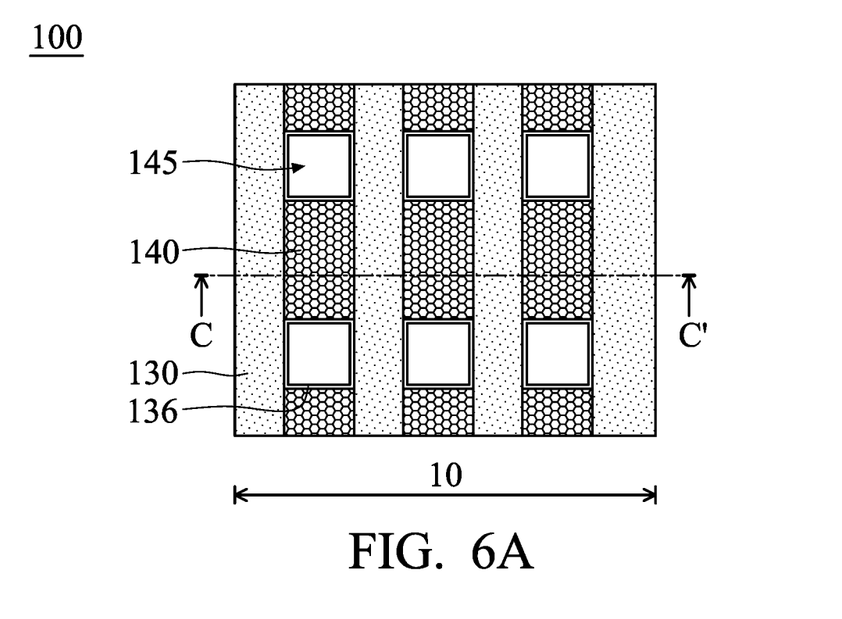
Figure 6B:
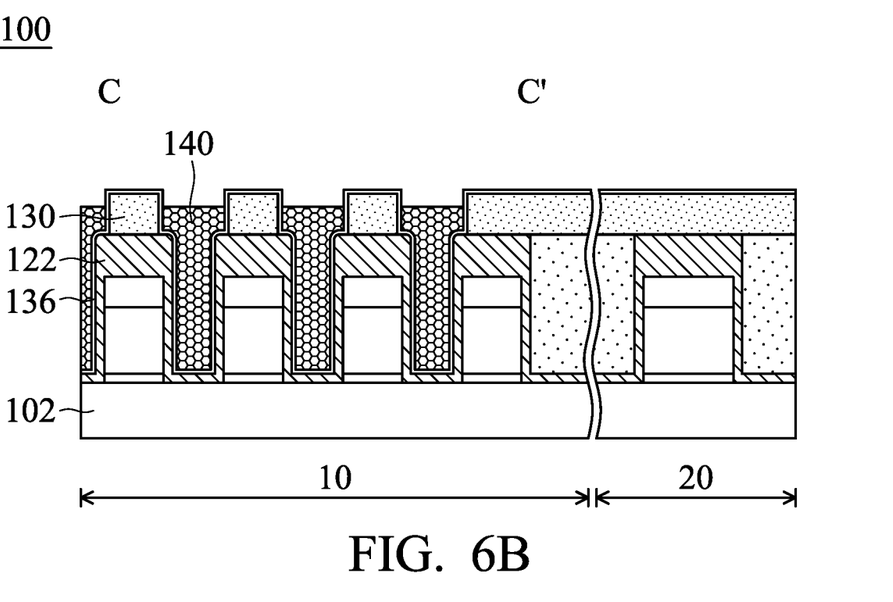

FIG. 6B is a cross-sectional view taken along line CC' of FIG. 6A. Referring to FIGS. 6A and 6B, an etch-back process is performed to remove the photoresist material 140 remaining in the first openings 145 and expose the protective liner 136 on the top of the second dielectric layer 130. The top surface of the photoresist material 140 is lower than the top surface of the protective liner 136 on the top surface of the second dielectric layer 130.

If the photoresist material 140 remains in the first opening 145, the electrical resistance value between the subsequent contact plug and the substrate will be increased. More specifically, when the first dielectric layer 122 at the bottom of the first opening 145 is subsequently removed, the remaining photoresist material 140 may prevent the first dielectric layer 122 underneath it from being removed. As a result, a portion of the first dielectric layer 122 remains on the surface of the substrate 102, and the contact area of the contact plug with the substrate 102 is reduced. As a result, the contact impedance between the contact plug and the substrate will increase, which is disadvantageous for the operation of the memory device 100.

Figure 7A:
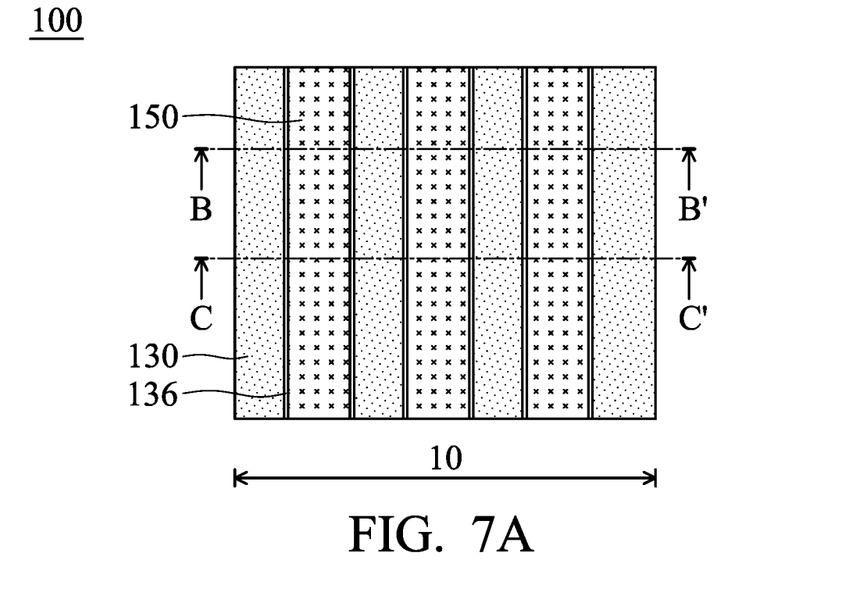
Figure 7B:
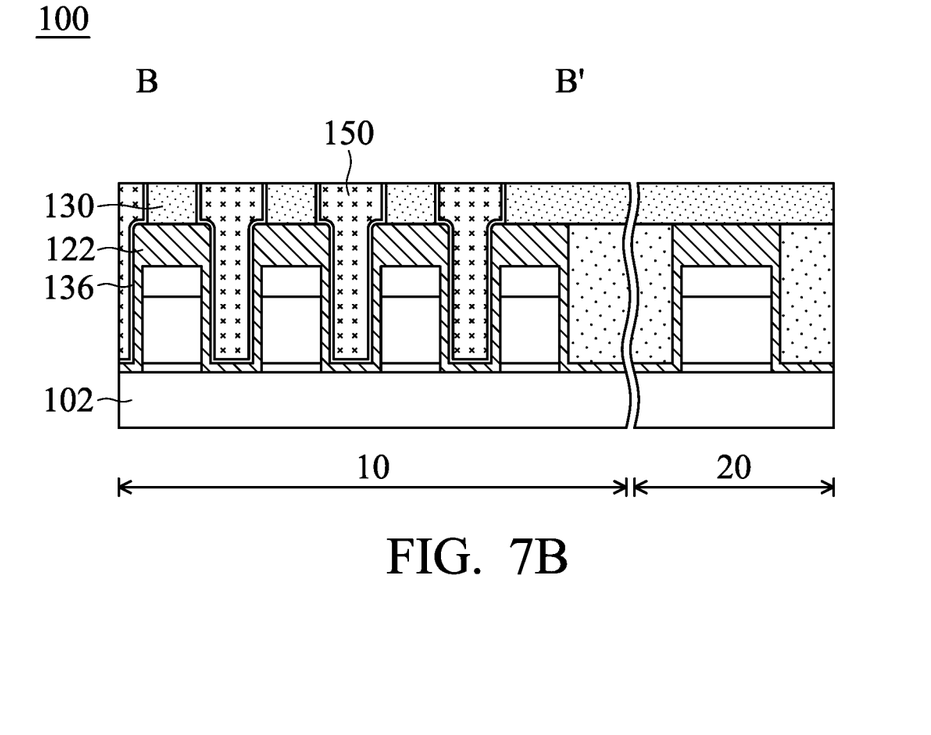
Figure 7C:
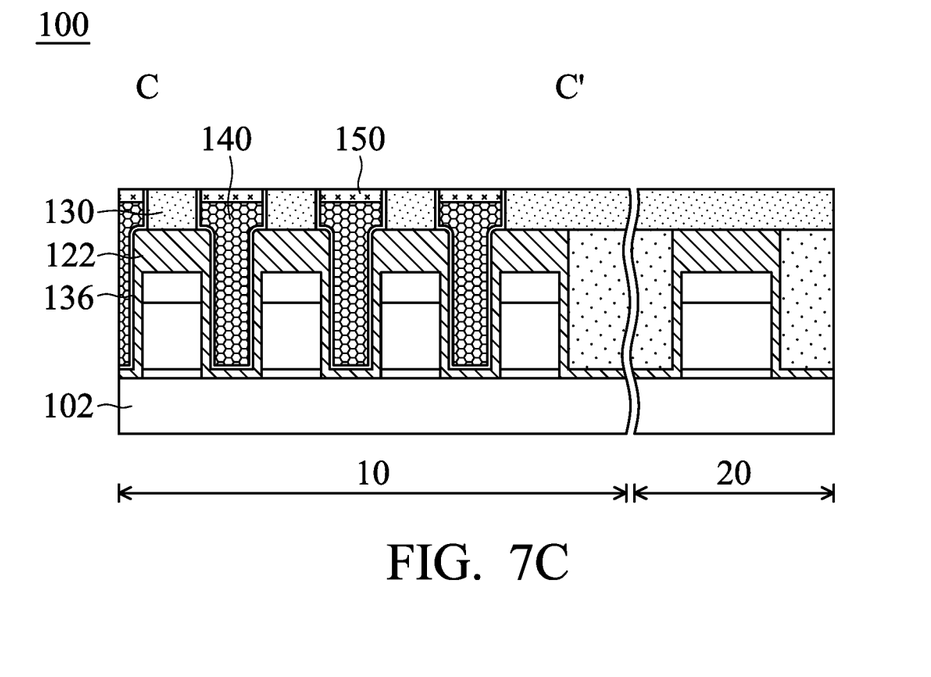

FIG. 7B is a cross-sectional view taken along line BB' of FIG. 7A, and FIG. 7C is a cross-sectional view taken along line CC' of FIG. 7A. Referring to FIGS. 7A, 7B, and 7C, the sacrificial layer 150 is formed on the protective liner 136 and the photoresist material 140, and filled into the first opening 145. Then, a planarization process is performed to expose the top surface of the second dielectric layer 130.

As shown in FIG. 7C, the sacrificial layer 150 covers the photoresist material 140 and is in direct contact with the photoresist material 140. If the sacrificial layer 150 is formed at a high temperature, the photoresist material 140 may be degraded or deformed due to the high temperature. As a result, it is disadvantageous for forming the third dielectric layer 160. Therefore, in order to prevent the photoresist material 140 from being degraded or deformed, the sacrificial layer 150 may be formed at a low temperature. The sacrificial layer 150 is an oxide and may be formed by a low temperature atomic layer deposition process. In some embodiments, the sacrificial layer 150 is formed at a temperature in the range of about 50° C. to about 120° C. In other embodiments, the sacrificial layer 150 is formed at a temperature in the range of about 70° C. to about 80° C.

Figure 8A:
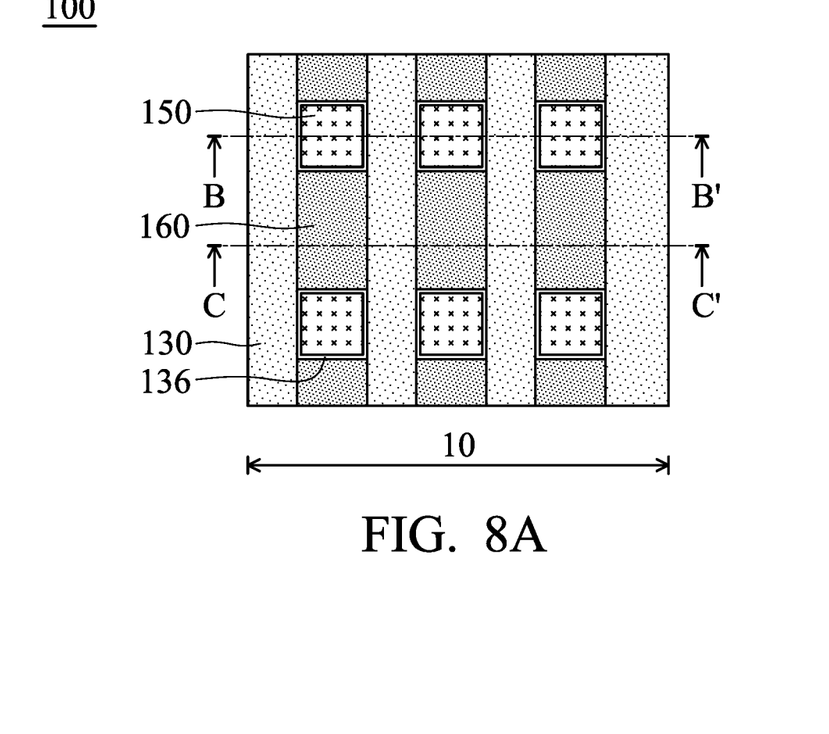
Figure 8B:
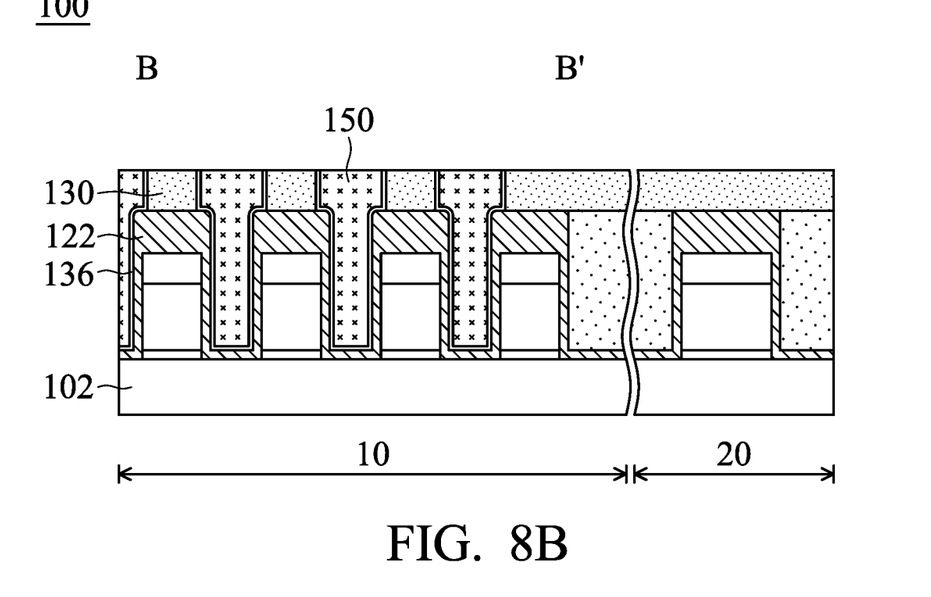
Figure 8C:
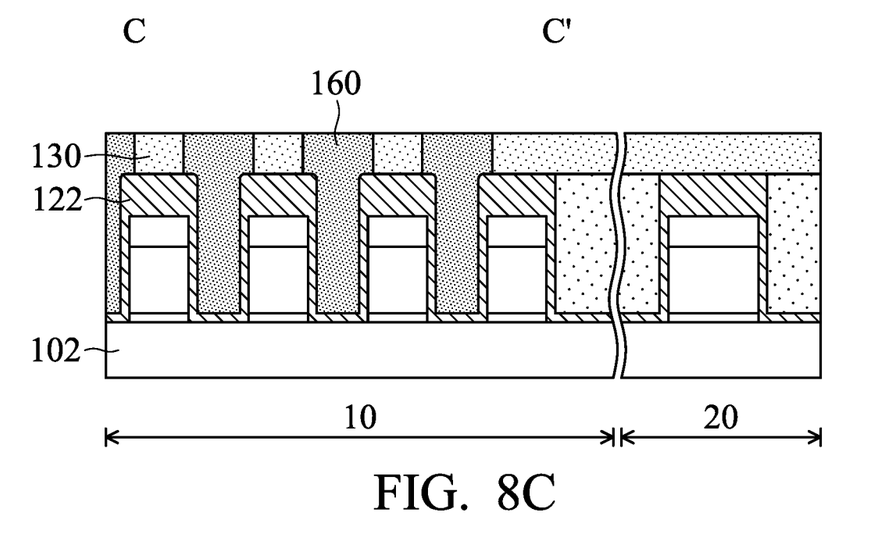

FIGS. 8B and 8C are cross-sectional views taken along line BB' and line CC' of FIG. 8A, respectively. Referring to FIGS. 8A, 8B, and 8C, the photoresist material 140 is exposed by removing a portion of the sacrificial layer 150 which was on the photoresist material 140 (referring to FIG. 7C) via an etch-back process. Then, the photoresist material 140 and a portion of the protective liner 136 are selectively removed to form a plurality of second openings that are defined by the adjacent first gate structures 110 and the adjacent sacrificial layer 150. Then, the second openings are filled with the third dielectric layer 160. Then, a planarization process is performed to remove the excess third dielectric layer 160 and expose the top surface of the second dielectric layer 130 and the top surface of the sacrificial layer 150.

The third dielectric layer 160 may include a nitride dielectric material. In some embodiments, the third dielectric layer 160 is silicon nitride. It should be noted that the first dielectric layer 122 and the third dielectric layer 160 may be made of different nitrides. In some embodiments, the first dielectric layer 122, the second dielectric layer 130, and the third dielectric layer 160 are made of the same nitride and formed by the same process. As a result, the process can be simplified and production time and costs can be reduced. In other embodiments, the first dielectric layer 122 and the second dielectric layer 130 are made of the same nitride, and the third dielectric layer 160 is made of another different nitride. In this way, the third dielectric layer 160 may be selected as needed, which can increase the flexibility of the process.

Figure 9A:
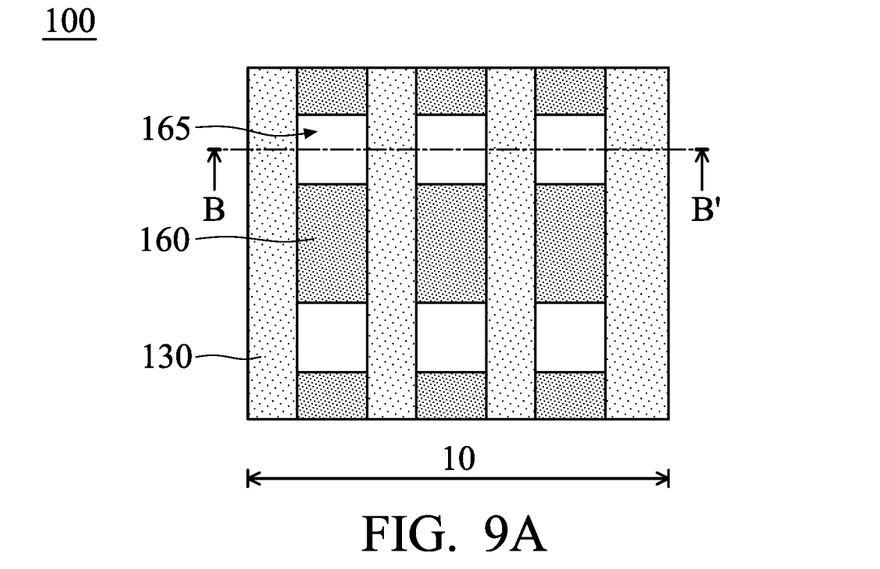
Figure 9B:
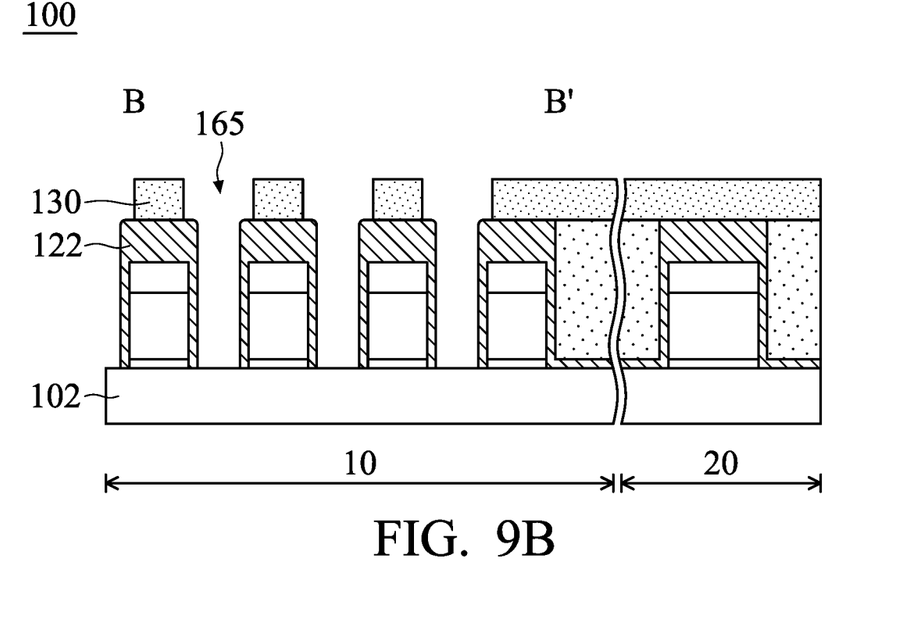

FIG. 9B is a cross-sectional views taken along line BB' of FIG. 9A. Referring to FIGS. 9A and 9B, a second etching process is performed to remove the remaining portions of the sacrificial layer 150 and the protective liner 136 to form a plurality of contact holes 165. Each of the contact holes 165 is defined by two adjacent first gate structures 110 and two adjacent third dielectric layers 160. After performing the second etching process, the first dielectric material 122b on the substrate 102 between the first gate structures 110 is removed, such that the top surface of the substrate 102 between the first gate structures 110 is exposed. The top surface of the substrate 102 is used to electrically connect to a subsequently formed contact plug.

The second etching process may be dry etching, wet etching, or a combination thereof. The contact hole 165 has a high aspect ratio. Therefore, in comparison with the dry etching, the sacrificial layer 150 located in the contact hole 165 may be removed more efficiently by the wet etching. In some embodiments, the second etching process is a wet etching process.

As described above, if the sacrificial layer 150 is not completely removed, the contact impedance between the substrate 102 and a subsequently formed contact plug increases, which is disadvantageous for the operation of the memory device 100. In some embodiments, in order to avoid the increase of the contact impedance and the damage to other layers, the etching rate of the sacrificial layer 150 is greater than that of the first dielectric layer 122, the second dielectric layer 130, and the third dielectric layer 160 during the second etching process. In some embodiments, the ratio R3/R4 of the etching rate R3 of the sacrificial layer 150 to the etching rate R4 of the first dielectric layer 122 is 50-1000 during the second etching process. In other embodiments, the ratio R3/R4 of the etching rate R3 of the sacrificial layer 150 to the etching rate R4 of the first dielectric layer 122 is 100-700 during the second etching process. In yet other embodiments, the ratio R3/R4 of the etching rate R3 of the sacrificial layer 150 to the etching rate R4 of the first dielectric layer 122 is 200-300 during the second etching process.

Furthermore, in some embodiments, contact holes 166 (shown in FIG. 10B) are formed in the peripheral region 20. For example, the array region 10 may be covered by a mask layer. Next, the first dielectric layer 122 and the second dielectric layer 130 of the peripheral region 20 are patterned to form the contact hole 166 that exposes the second gate structure 120.

Figure 10A:
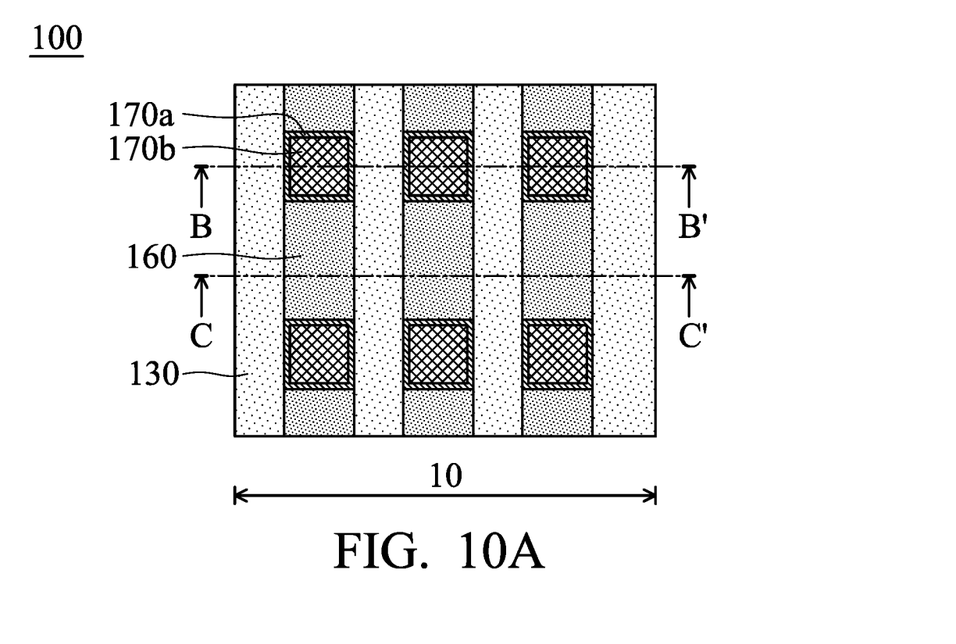
Figure 10B:
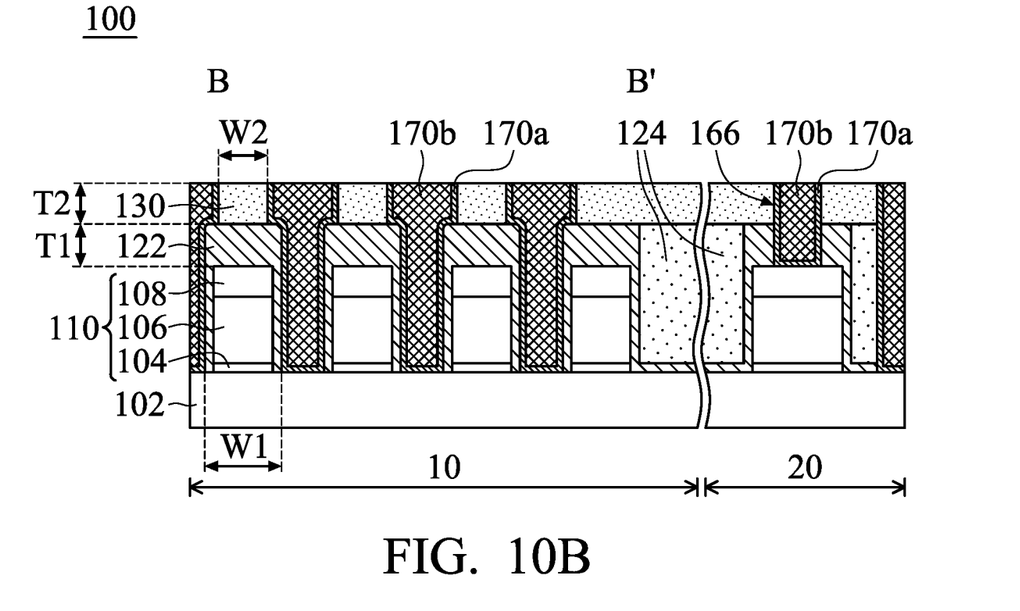
Figure 10C:
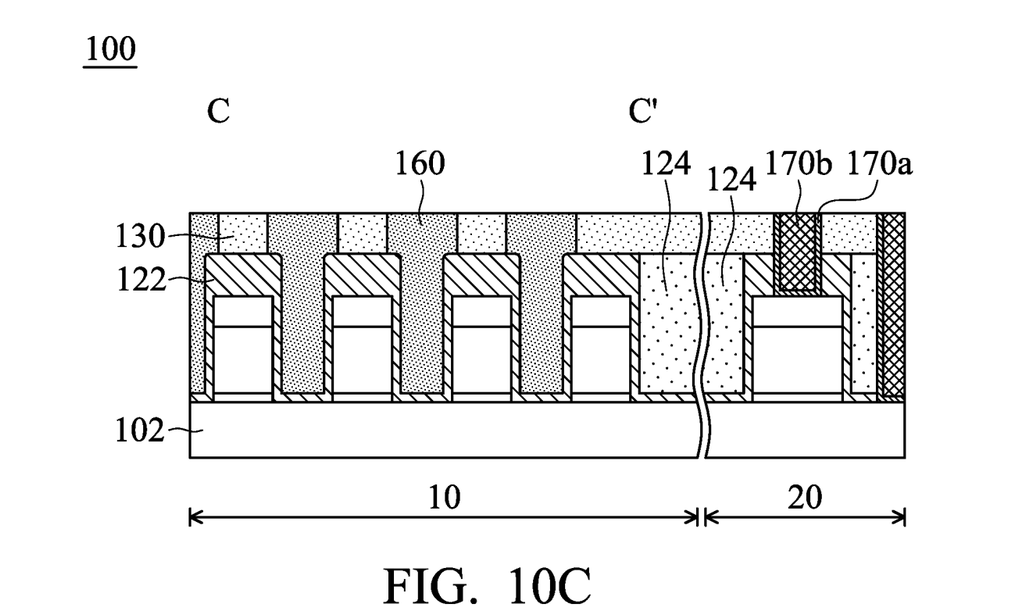

FIG. 10B is a cross-sectional view taken along line BB' of FIG. 10A, and FIG. 10C is a cross-sectional view taken along line CC' of FIG. 10A. Referring to FIGS. 10A, 10B, and 10C, the conductive material is filled into the contact holes 165 and 166 to form contact plugs. More specifically, a conductive liner 170a may be conformally formed in the contact holes 165 and 166. Then, a conductive plug 170b is formed on the conductive liner 170a and fills the contact holes 165 and 166. Next, a planarization process is performed to expose the top surface of the second dielectric layer 130 and the top surface of the third dielectric layer 160. For the purpose of simplicity, the conductive liner 170a and the conductive plug 170b are collectively referred to herein as "contact plugs".

The function of the conductive liner 170a is to improve the adhesion between the conductive material (such as the conductive plug 170b) and the dielectric material (such as the first dielectric layer 122, the second dielectric layer 130, and the third dielectric layer 160). The conductive liner 170a may include titanium, titanium nitride, tantalum, tantalum nitride, other suitable conductive liner material, or a combination thereof. The function of the conductive plug 170b is to provide an electrical connection of an element in the substrate 102 or the second gate structure 120 with an external circuit. The conductive plug 170b may include tungsten, aluminum, copper, gold, silver, other suitable conductive material, or a combination thereof.

Figure 11:
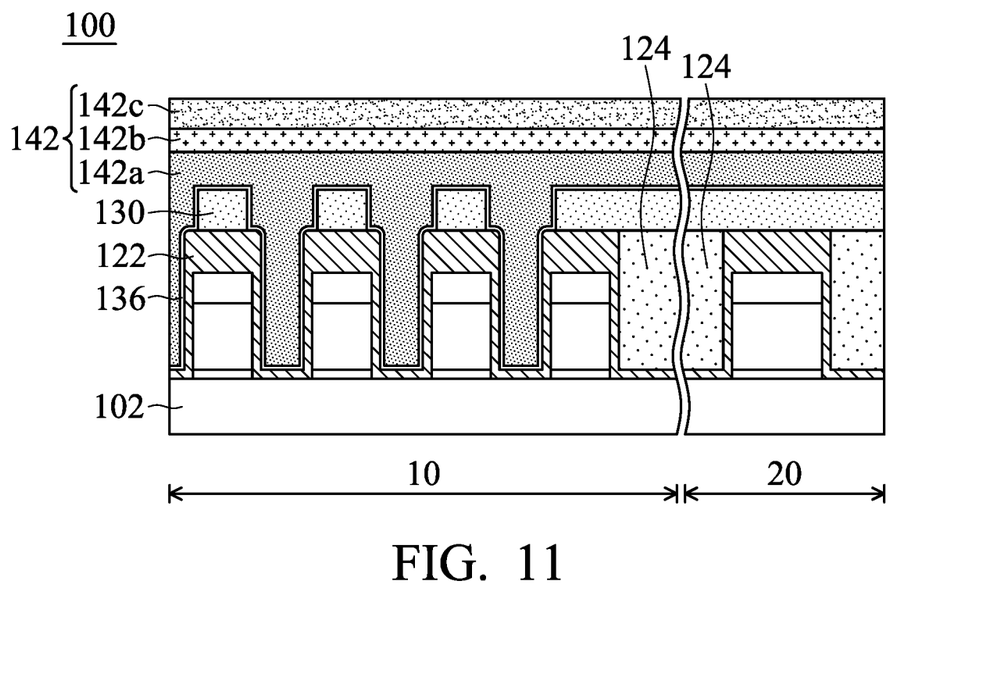
FIG. 11 shows a cross-sectional view of a memory device at a stage of the manufacturing process in accordance with other embodiments.

FIG. 11 shows a cross-sectional view of a memory device 100 at a stage of the manufacturing process in accordance with other embodiments. FIG. 11 is similar to FIG. 4 except that the photoresist material 140 is replaced by the multilayer structure 142 that including photoresist material. The multilayer structure 142 includes a bottom layer material 142a, a middle layer material 142b, and a photoresist material 142c. More specifically, after the first etching process is performed to form self-aligned trenches 135 (as shown in FIG. 3), the bottom layer material 142a is filled into the self-aligned trenches 135. Then, the middle layer material 142b is formed over the bottom layer material 142a, and the photoresist material 142c is formed over the middle layer material 142b. The bottom layer material 142a, the middle layer material 142b, and the photoresist material 142c may have a substantially flat top surface. That is, the photoresist material 142c may have a flat bottom surface. After the multilayer structure 142 is formed, the processes of FIGS. 5A to 10A described above may be performed, and the details will not be repeated here.

In some embodiments, the bottom layer material 142a may be a bottom anti-reflective coating (BARC) material. In some embodiments, the bottom layer material 142a may be an organic anti-reflective material or an inorganic anti-reflective material (such as silicon oxycarbide). The middle layer material 142b may be a silicon-rich bottom anti-reflective coating (Si-rich BARC) material. For example, the middle layer material 142b may be a silicon-rich silicon oxide, a silicon-rich silicon oxynitride, or a silicon-rich silicon oxycarbide. The material of the photoresist material 142c may be the same as or similar to that of the photoresist material 140, and the details will not be repeated here.

In comparison with the embodiment shown in FIG. 4, because the photoresist material 142c is not filled into the self-aligned trenches 135, the thickness of the photoresist material 142c is much less than the thickness of the photoresist material 140. Therefore, the exposure energy and exposure duration can be reduced, and the production efficiency is further improved. Moreover, in comparison with the photoresist material 140, the bottom layer material 142a has a better hole-filling ability. Therefore, this embodiment is more suitable in cases where the aspect ratio of the self-aligned trench 135 is higher. As a result, it is advantageous for the miniaturization of the memory device.

In addition, a memory device is provided in some embodiments of the present invention. Referring to FIG. 10A to FIG. 10C, the memory device 100 has an array region 10 and a peripheral region 20. The memory device 100 may include a substrate 102, a plurality of first gate structures 110, a first dielectric layer 122, a second dielectric layer 130, a third dielectric layer 160, and a plurality of contact plugs. These first gate structures 110 are formed on the substrate 102 of the array region 10. In addition, the memory device 100 may include a plurality of second gate structures 120 formed on the substrate 102 of the peripheral region 20.

The first dielectric layer 122 is formed on the top surfaces and the sidewalls of the first gate structures 110 and the second gate structures 120, and is formed on the substrate 102. Therefore, in the subsequent etching process, the first dielectric layer 122 may protect the first gate structures 110 and the second gate structures 120 from being damaged.

The memory device 100 may include gap-filling dielectric structures 124. In the array region 10, the gap-filling dielectric structure 124 is located only on the outer sidewall of the first dielectric layer 122 on the first gate structure 110 that is closest to the peripheral region 20, and the top surface of the gap-filling dielectric structure 124 is coplanar with the top surface of the first dielectric layer 122. In the peripheral region 20, the gap-filling dielectric structure 124 is located on the sidewalls of the first dielectric layer 122 on both sides of the second gate structure 120. By forming the gap-filling dielectric structure 124, the problem caused by the aforementioned loading effect may be avoided.

The second dielectric layer 130 is formed on the first dielectric layer 122 and is in direct contact with the first dielectric layer 122. In addition, the second dielectric layer 130 may extend over the gap-filling dielectric structures 124.

The third dielectric layer 160 is formed between the adjacent first gate structures 110. The adjacent first gate structure 110 and the adjacent third dielectric layer 160 define a contact hole 165 that exposes the substrate 102. In addition, the peripheral region 20 may also include a contact hole 166 that exposes the second gate structure 120. The contact holes 165 and 166 are filled with the contact plugs. The contact plug includes the conductive liner 170a and the conductive plug 170b. In the array region 10, the sidewalls of the contact plugs are in direct contact with the third dielectric layer 160.

The first dielectric layer 122 and the second dielectric layer 130 are made of the same material, and the first dielectric layer 122 and the gap-filling dielectric structure 124 are made of different materials. In some embodiments, the first dielectric layer 122 and the second dielectric layer 130 are nitrides, and the gap-filling dielectric structure 124 is made of oxide.

As described above, because the first dielectric layer 122 (and/or the second dielectric layer 130) and the gap-filling dielectric structure 124 are different materials, the first etching process may have two steps with different etch selectivity to selectively remove the second dielectric layer 130 and the gap-filling dielectric structure 124 respectively. Therefore, the gap-filling dielectric structure 124 between the first dielectric layers 122 can be completely removed by the first etching process to form the self-aligned trenches 135. As a result, the contact impedance between the substrate 102 and the contact plug can be reduced.

The inventors of the present invention have found that the reliability of the memory device 100 can be improved by using nitrides to form the first dielectric layer 122 and the second dielectric layer 130. More specifically, the inventors of the present invention have found that the reliability of the memory device 100 can be significantly improved by controlling the total thickness of the first dielectric layer 122 and the second dielectric layer 130 within a specific range.

Referring to FIG. 10B, in the array region 10, the first dielectric layer 122 has a first thickness T1 from the top surface of the first gate structure 110, and the second dielectric layer 130 has a second thickness T2 from the top surface of the dielectric layer 122. In some embodiments, the total thickness (T1+T2) of the first dielectric layer 122 and the second dielectric layer 130 from the top surface of the first gate structure 110 is 50-150 nm. In other embodiments, the total thickness (T1+T2) of the first dielectric layer 122 and the second dielectric layer 130 from the top surface of the first gate structure 110 is 60-120 nm. In some embodiments, the total thickness (T1+T2) of the first dielectric layer 122 and the second dielectric layer 130 from the top surface of the first gate structure 110 is 70-90 nm.

Referring to FIG. 10B, in the array region 10, the first dielectric layer 122 on the first gate structure 110 has a first width W1, and the second dielectric layer 130 on the first gate structure 110 has a second width W2. The second width W2 is smaller than the first width W1. In other words, the width of the upper portion of the self-aligned trench 135 is greater than the width of the lower portion of the self-aligned trench 135. Therefore, it is advantageous for the filling of the conductive plug 170b, and the electrical resistance value of the contact plug can be reduced. Furthermore, for the same total thickness (T1+T2) of the first dielectric layer 122 and the second dielectric layer 130, if the proportion of the first thickness T1 is too large, the filling of the conductive plug 170b may not be efficient. On the other hand, if the proportion of the first thickness T1 is too small, the reliability of the memory device 100 may not achieve the requirement.

Therefore, in order to balance the reliability of the memory device and the filling of the conductive plug, the ratio (T1/T2) of the first thickness T1 of the first dielectric layer 122 to the second thickness T2 of the second dielectric layer 130 may be adjusted to a specific range. In some embodiments, the ratio (T1/T2) of the first thickness T1 of the first dielectric layer 122 to the second thickness T2 of the second dielectric layer 130 is 0.1-10.0. In other embodiments, the ratio (T1/T2) of the first thickness T1 of the first dielectric layer 122 to the second thickness T2 of the second dielectric layer 130 is 0.5-3.0.

In conclusion, the memory device and its manufacturing method of the embodiments of the present invention at least include the following advantages:

(1) In some embodiments of the present invention, the first dielectric layer covers the substrate, the first gate structures, and the second gate structures. Therefore, in the subsequent etching process, the first dielectric layer can protect the first gate structures and the second gate structures from being damaged.

(2) In some embodiments of the present invention, the gap-filling dielectric structure can be formed by a spin coating process. Therefore, the problems caused by the seams can be avoided. As a result, the reliability of the memory device can be improved.

(3) In some embodiments of the present invention, the second dielectric layer has a substantially uniform thickness, which is advantageous for the uniformity of the subsequent first etching process.

(4) In some embodiments of the present invention, the first dielectric layer and the second dielectric layer are made of nitride, and the total thickness of the first dielectric layer and the second dielectric layer is controlled within a specific range. Therefore, the reliability of the memory device can be significantly improved.

(5) In some embodiments of the present invention, the method for manufacturing the memory device can effectively improve the yield of the memory device and reduce the critical dimension of the memory device under the premise of reducing the process complexity and the production cost.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:
1. A memory device, comprising:
a substrate;
a plurality of first gate structures formed on the substrate;
a first dielectric layer formed on top surfaces and sidewalls of the plurality of first gate structures;
a second dielectric layer formed on the first dielectric layer, such that a vertical projection of the second dielectric layer on the substrate is overlapped with vertical projections of the plurality of first gate structures on the substrate, wherein the second dielectric layer is in direct contact with the first dielectric layer, and the second dielectric layer and the first dielectric layer are made of a same material;
a third dielectric layer formed on the first dielectric layer which is between the plurality of first gate structures, wherein the third dielectric layer defines a plurality of contact holes exposing the substrate; and
a contact plug filling the plurality of contact holes,
wherein the memory device comprises an array region and a peripheral region, and the plurality of first gate structures are formed in the array region.

2. The memory device as claimed in claim 1, wherein the first dielectric layer and the third dielectric layer are nitrides.

3. The memory device as claimed in claim 1, wherein the first dielectric layer, the second dielectric layer, and the third dielectric layer are made of the same material.

4. The memory device as claimed in claim 1, wherein:
in the array region, a width of the second dielectric layer on the first gate structure is smaller than a width of the first dielectric layer on the first gate structure.

5. The memory device as claimed in claim 4, wherein a total thickness of the first dielectric layer and the second dielectric layer from the top surface of the first gate structure is 50-150 nm.

6. The memory device as claimed in claim 2, further comprising a gap-filling dielectric structure, wherein in the array region, the gap-filling dielectric structure is located only on an outer sidewall of the first dielectric layer on the first gate structure closest to the peripheral region, a top surface of the gap-filling dielectric structure is coplanar with a top surface of the first dielectric layer, and the gap-filling dielectric structure and the first dielectric layer are made of different materials.

7. The memory device as claimed in claim 6, further comprising a second gate structure formed in the peripheral region, wherein the first dielectric layer is also formed on a top surface and sidewalls of the second gate structure, and the gap-filling dielectric structure is located on sidewalls of the first dielectric layer on both sides of the second gate structure.

8. The memory device as claimed in claim 7, wherein the second dielectric layer extends over the gap-filling dielectric structure.

9. The memory device as claimed in claim 7, wherein the gap-filling dielectric structure is an oxide, and a top surface of the second dielectric layer in the array region is coplanar with the top surface of the second dielectric layer in the peripheral region.

10. The memory device as claimed in claim 1, wherein the first dielectric layer has a first thickness T1 from the top surface of the first gate structure, the second dielectric layer has a second thickness T2 from a top surface of the first dielectric layer, and a ratio T1/T2 of the first thickness T1 to the second thickness T2 is 0.1-10.0.

11. The memory device as claimed in claim 1, wherein in the array region, a sidewall of the contact plug is in direct contact with the third dielectric layer.

* * * * *